(12) United States Patent
Kawai

(10) Patent No.: US 6,545,570 B2
(45) Date of Patent: Apr. 8, 2003

(54) TUNING CIRCUIT INCLUDING A NEGATIVE IMPEDANCE CIRCUIT

(75) Inventor: Kazuo Kawai, Tokyo (JP)

(73) Assignee: General Research of Electronics, Inc., Tokyo (JP)

(*) Notice: Subject to any disclaimer, the term of this patent is extended or adjusted under 35 U.S.C. 154(b) by 0 days.

(21) Appl. No.: 09/939,361

(22) Filed: Aug. 24, 2001

(65) Prior Publication Data

US 2002/0101306 A1 Aug. 1, 2002

(30) Foreign Application Priority Data

Jan. 29, 2001 (JP) ........................................ 2001-019748

(51) Int. Cl.[7] .............................................. H03H 11/52
(52) U.S. Cl. ........................................ 333/216; 333/213
(58) Field of Search ............................. 331/107, 117 D, 331/117 R, 117 FE; 327/568; 330/5; 333/213, 216, 223, 17.1; 257/40; 310/318, 51

(56) References Cited

U.S. PATENT DOCUMENTS

| | | | | |
|---|---|---|---|---|
| 4,147,997 A | * | 4/1979 | Greaves | ....................... 333/214 |
| 5,451,915 A | * | 9/1995 | Katzin et al. | ................. 333/213 |
| 5,550,520 A | * | 8/1996 | Kobayashi | ................... 333/213 |
| 6,043,510 A | * | 3/2000 | Kawamoto | .................... 257/40 |
| 6,175,285 B1 | * | 1/2001 | Gabara | .................... 331/117 R |

* cited by examiner

*Primary Examiner*—Patrick Wamsley
(74) *Attorney, Agent, or Firm*—Flynn, Thiel, Boutell & Tanis, P.C.

(57) ABSTRACT

A tuning circuit has a simple circuit construction and is capable of setting Q thereof to a high desired value. The tuning circuit is formed by a resonance circuit consisting of an inductor and a capacitor and a negative resistance circuit connected in series to the resonance circuit including a negative impedance converter and a variable resistor. A counter counts clock signals from a clock signal generating circuit and a count value is converted to an analog signal by a D/A converter. The negative resistance circuit is controlled by the analog signal so that an effective resistance of the tuning circuit is made negative to oscillate and to vary a negative resistance value in a positive direction. When the effective resistance value becomes zero, oscillation stops and thereafter when a value of Q becomes a predetermined value, the clock signals are stopped and the latch circuit holds a final count value.

14 Claims, 2 Drawing Sheets

TUNING CIRCUIT INCLUDING A NEGATIVE IMPEDANCE CIRCUIT

BACKGROUND OF THE INVENTION

1. Field of the Invention

The present invention relates to a tuning circuit capable of increasing Q thereof up to a desired predetermined value wherein a negative resistance circuit is added to a resonance circuit comprising an inductor and an capacitor.

2. Description of the Related Art

There are methods using a negative resistance circuit as a method for increasing Q of a tuning circuit. As one of them a regenerative detection method has been many used. However, it is necessary to set up a positive feedback circuit whenever a tuning frequency is changed because the positive feedback circuit is used on the eve of oscillation.

So, the inventor has filed an automatic setting method of a tuning frequency in order to improve this drawback, which is disclosed in Japanese Patent Application No. 2000-400944. Said method is as follows. In a tuning circuit comprising a resonance circuit consisting of an inductor L and a capacitor C and a negative resistance circuit connected to it in series, when a composite value (an effective resistance value) of a negative resistance value of the negative resistance circuit and an original series resistance value of the tuning circuit becomes negative, the tuning circuit oscillates, when the effective resistance value is caused to oscillate in this condition, an amplitude of an oscillation signal varies. So, the original series resistance value of the tuning circuit can be calculated from relation between two values of the negative resistance value by detecting the amplitudes of the oscillation signal corresponding to said two values. Since $\omega L$ is known, a negative resistance value to be set can be obtained by determining a value of Q to be set if this original series resistance value is known.

Since content of the above operation is described in the above application, detailed explanation thereof is omitted but a several operations containing multiplication and division are necessary to do it. Therefore, this method requires operational circuits and hold circuit for holding operational result therefrom.

In the above method, requirement of the hold circuit of operational result is inevitable but it is desirable to get along all right without complicated operational circuits (ex. multiplication and division circuits) if possible.

SUMMARY OF THE INVENTION

An object of the invention is to provide a tuning circuit capable of setting Q thereof to a desired high predetermined value by a very simple circuit without using the above operational circuits.

In order to achieve the above object a tuning circuit of the invention includes a resonance circuit composed of an inductor and a capacitor and a negative resistance circuit connected to said resonance circuit in series and is characterized by employment of a negative resistance control means for setting a negative resistance value of said negative resistance circuit so as to make an effective resistance value of said tuning circuit be negative to oscillate it and for varying said negative resistance value so as to make it be positive; and stop and hold means for stopping variation of said negative resistance value at a time when said effective resistance value becomes a positive predetermined value and for holding said value.

In the present invention, it is preferred that said negative resistance control means includes a counter for counting a clock signal and is constituted to control said negative resistance value in response to a count output of the counter, and said stop and hold means a latch circuit for stopping count of the clock signal due to said counter said time and for holding the count output at said time. Further, in the present invention, it is preferred that said stop and hold means comprises setting means for setting said positive predetermined value and that the tuning circuit may comprise means for switching input and output terminal of said tuning circuit therefrom.

DETAILED DESCRIPTION OF THE PREFERRED EMBODIMENTS

Figure 1A:
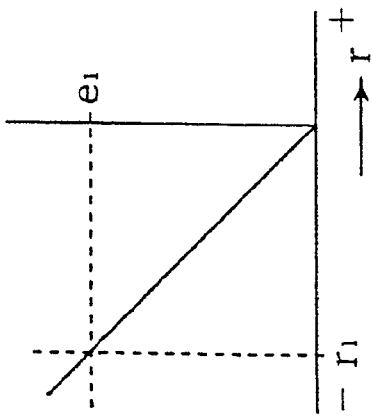
FIGS. 1(a) (b) and (c) are graphs for explaining behavior of the invention.

As previously described, in a tuning circuit including a resonance circuit composed of an inductor and a capacitor and a negative resistance circuit connected to said resonance circuit in series, the negative resistance value of the negative resistance circuit is scanned with a constant speed in a positive direction in condition wherein the effective resistance value is made negative to oscillate, so that an amplitude of the oscillation signal decreases continuously in proportion to decrease of an absolute value of the effective resistance value and said amplitude of the oscillation signal becomes zero when the effective resistance value becomes just zero. Thereafter, since the effective resistance increases as a positive resistance by making said negative resistance value to vary further, of course, oscillation does not happen and Q decreases together with increase of the effective resistance. Accordingly, if a time when the amplitude of the oscillation signal becomes zero can be detected, the time is a time when the original series resistance component of the tuning circuit is just cancelled by the negative resistance of the negative resistance circuit. The effective resistance value increases continuously in a positive direction therefrom but since its variation speed is obvious, it is preferred to stop said scanning when the effective resistance value reaches at an object value to be set corresponding to desired Q.

Such scanning operation can be realized by analog circuits but as another method, it can be realized by digital system wherein a clock signal generating circuit and a counter circuit to count clock therefrom are provided and the negative resistance is controlled by means of an analog value to which a counter output is converted. Since most of a digital circuit to effect such digital operation can be constituted by simple logic circuits, it is possible to miniaturize circuit size thereof and to make it simple and further hold characteristic thereof can be made better than that of an analog circuit.

An embodiment of the present invention will be explained in detail by referring to the drawings as follows.

Firstly, relation between an effective resistance value r and an amplitude e of an oscillation signal will be explained.

Figure 1B:
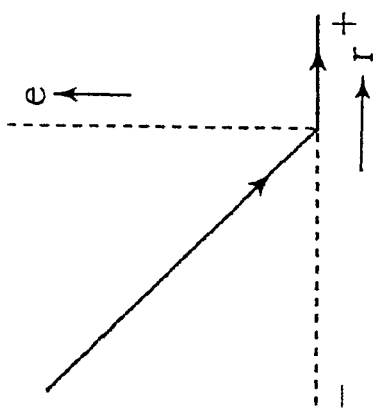

FIGS. 1(a) and (b) show said relation and when the effective resistance value r is scanned from a negative value to a positive value, the amplitude e becomes zero in $r \geq 0$ as shown in FIG. 1(b). FIG. 1(a) shows variation of the effective resistance value r in the passage of this time wherein after r=0 at $t_0$, r continues to increase as a positive resistance and becomes $r_D$ corresponding to a desired Q to be set at time $t_1$ and then this value is kept.

Figure 2:
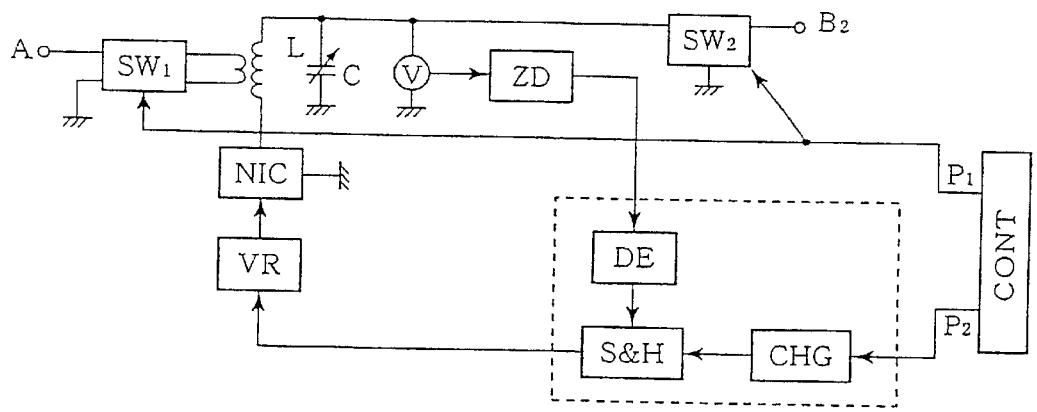
FIG. 2 is a circuitry structural drawing for explaining an embodiment of the preferred invention.

FIG. 2 shows a circuit diagram for explaining an embodiment of a tuning circuit of the present invention constituted by analog circuits. In the same figure, A is a signal input terminal from an antenna of a receiver or a RF amplifier and etc., B is a signal output terminal, $SW_1$ and $SW_2$ are switch circuits, L and C are an inductor and a capacitor which constitutes a resonance circuit for tuning, ZD is a zero point detecting circuit, DE is a delay circuit, CHG is a charge (discharge) circuit, S&H is a sample-hold circuit, VR is a variable resistor, NIC is a negative impedance converter, CONT is a control signal generating circuit and $P_1$ and $P_2$ are output signal lines therefrom.

Figure 1C:
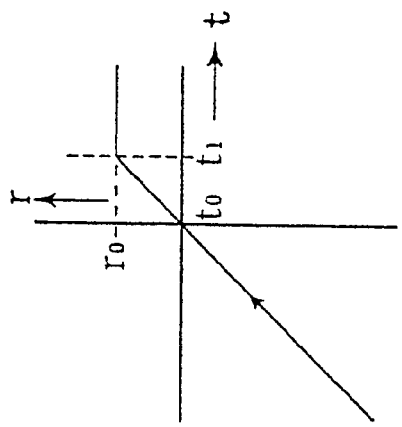

When the capacitor C is set to a predetermined capacity prior to tuning, the switch circuits $SW_1$ and $SW_2$ are operated by a control signal from the output signal line $P_1$ of the control signal generating circuit CONT to separate the tuning circuit from input and output circuits. This is done to prevent influence given by an oscillation signal to it and other. Nextly, the charge circuit CHG began to charge a capacitor therein (not shown). Since it is necessary that a charge start voltage is a voltage to make an input resistance value of the negative impedance converter NIC through the sample-hold circuit S&H and the variable resistor VR be negative (a value to make the effective resistance of the turning circuit, for example, be within an oscillation range as shown in FIG. 1(a), $r_1$), it is possible to have to use not the charge circuit but a discharge circuit depending on polarity relation between an input and an output of the sample-hold circuit S&H and the variable resistor VR. An input resistance of the negative impedance converter NIC is scanned so as to vary in a direction of positive resistance is response to voltage variation of the charge circuit CHG and the effective resistance value r varies toward a positive direction, that is, a zero ohm direction. At this time, the oscillation voltage decreases as shown in FIG. 1(b) but since this amplitude thereof is converted to a DC voltage by an amplitude detecting circuit V which is applied to the zero point detecting circuit ZD, a time when the oscillation signal amplitude becomes zero, that is, a time when oscillation stops (FIG. 1(c), $t_0$) is detected. This circuit ZD can be constituted by, for example, a second order differential circuit and a wave shaping circuit. When a time when oscillation stops in the zero point detecting circuit ZD is detected, a detected signal is applied to the sample-hold circuit S&H at a time delayed by $t_1$ shown in FIG. 1(c) through the delay circuit DE to sample a charge voltage and to hold it. This time point is a time point when the effective resistance becomes $r_D$ as previously described and Q is set to a predetermined value by stopping said scanning at this time point. Accordingly, a set value of Q may be changed by changing a delay time of the delay circuit DE. That is, the delay circuit DE is a setting circuit of Q.

In the above described embodiment, a sample-hold circuit of analog type utilizing charge of capacitor as said sample-hold circuit is used but there is a problem in its hold characteristics in case that one broadcast wave is received by a receiver for long time. In order to solve it, it may be considered to use digital signal circuits therein. That is, after a sample value is converted to a digital signal, it is applied to a latch circuit and an output thereof is converted to an analog value, thereby to utilize hold function of a latch circuit. In this case, it is of course to have to pay attention to quantified error in a digital signal section.

In the above method, a digital signal is utilized only in a part but if it is desirable to utilize a digital signal, miniaturizing and economizing is possible by digitalizing most of them.

Figure 3:
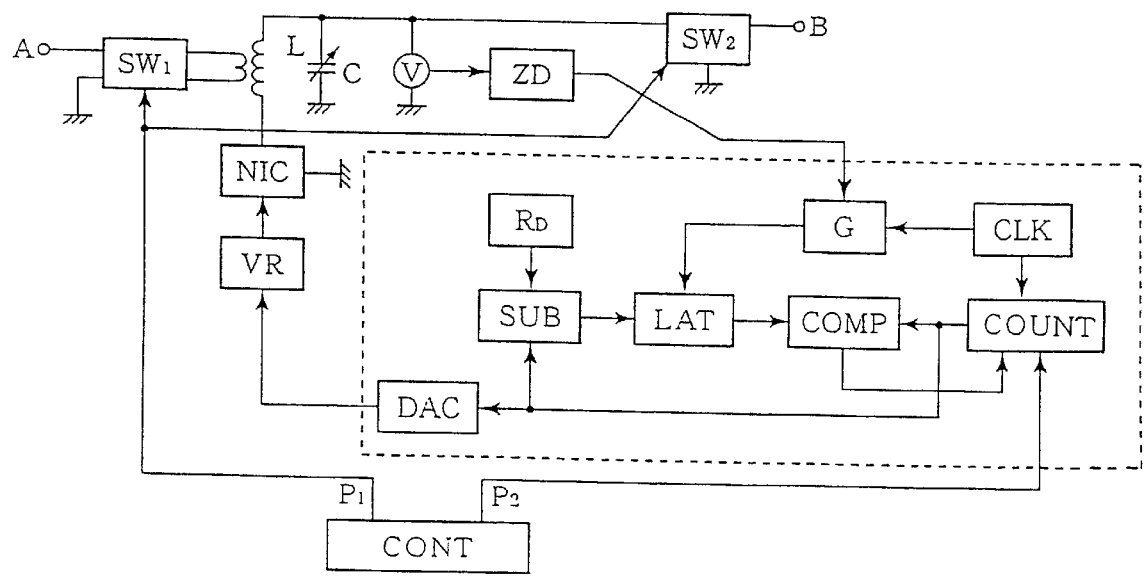
FIG. 3 is a block diagram showing another embodiment of the present invention.

FIG. 3 shows another embodiment of the present invention utilizing digital signal processing circuit, in which the same reference characters as in FIG. 2 indicate the same circuit or an analogous circuit and a part within dotted lines in FIG. 2 is exchanged for digital circuits as shown within dotted lines in FIG. 3. In a circuit within dotted lines in FIG. 3, CLK is a clock signal generating circuit, COUNT is a counter, COMP is a comparator, G is a gate circuit, LAT is a latch circuit, SUB is a subtracter, $R_D$ is an effective resistance setting circuit and DAC is a digital-analog circuit.

The counter COUNT is, first, set so as to make the effective resistance of the tuning circuit be negative through the digital-analog converter DAC, a variable resistor VR and the negative impedance converter NIC. Then the counter COUNT counts down (or counts up) a clock signal from the clock signal generating circuit CLK and then an output voltage of the digital-analog converter DAC decreases. For this reason, since a resistance value of the variable resistor VR decreases, an input impedance of the negative impedance converter NIC varies in a positive direction. Also a counter output is applied to the substracter SUB and always a value obtained by subtracting a value corresponding to a set value of the effective resistance setting circuit $R_D$ (a setting circuit of Q) from a count value at that time is applied to the latch circuit LAT (Now, since content of the counter COUNT is varying so as to decrease, it takes time until the counter output becomes that value by subtracting). Since clock for latch is applied to the latch circuit LAT through the gate circuit G at present time (in setting operation of the tuning circuit), the latch circuit LAT transfers an output of the subtracter SUB to the comparator COMP. Since the comparator COMP is set to produce an output when two inputs thereto are coincident with each other, in that condition, one of the two inputs of the comparator COMP from the subtracter SUB is always smaller than a counter output by a value corresponding to $r_D$ and thus a comparator output is not produced. Accordingly, further the counter COUNT continues to count down and the oscillation signal amplitude continues to decrease. When the effective resistance becomes zero ohms and oscillation stops, since it is detected by the zero point detecting circuit ZD that said amplitude becomes zero, the gate circuit G closes and the latch circuit LAT holds a final value therein. Further the counter COUNT continues to count down and the counter output becomes equal to the latch circuit output $t_1$ sec later since a zero point has been detected and the comparator COMP detects this to stop count of the counter COUNT. Q of the tuning circuit is set to a predetermined value according to this. Therefore since the zero point detecting circuit ZD does not operate, content of the counter COUNT is held as it is.

As is apparent from the above explanation, according to the present invention, Q of the tuning circuit can be set to a high desired predetermined value with simple operation and short time.

Also since Q can be set to a high predetermined value even if a tuning frequency is changed, always stable receiving is attained with high selectivity and in addition circuits for that purpose require no complicated operating function but very simple circuit construction. In particular, the tuning circuit of the present invention can be constituted digitally all by logic circuits except for switch circuits and a negative impedance converter and thus can be miniaturized.

What is claimed is:

1. A tuning circuit including a resonance circuit having an inductor and a capacitor, and a negative resistance circuit connected in series to said resonance circuit comprising:

a negative resistance controller for setting a negative resistance value of said negative resistance circuit so as to make an effective resistance value of said tuning circuit negative to oscillate the tuning circuit and for varying said negative resistance value so as to make the effective resistance value positive; and a stop and hold circuit for stopping variation of said negative resistance value at a time when the effective resistance value becomes a positive predetermined value and for holding the negative resistance value, wherein a predetermined Q value for the tuning circuit is set.

2. The tuning circuit according to claim 1, wherein said negative resistance controller includes a counter for counting a clock signal to control said negative resistance value in response to a count output of the counter, and said stop and hold circuit includes a latch circuit for stopping count of the clock signal to said counter at said time when the effective resistance value becomes the positive predetermined value and for holding the count output at said time.

3. The tuning circuit according to claim 1, wherein said stop and hold circuit includes a setting circuit for setting the positive predetermined value.

4. The tuning circuit according to claim 1, further comprising switching circuits for switching input and output terminals of said tuning circuit.

5. A tuning circuit for providing a predetermined Q value comprising:

a resonance circuit including an inductor and a capacitor;

a negative impedance circuit having a negative impedance value connected in series with said resonance circuit;

a negative impedance controller for controlling the negative impedance value of said negative impedance circuit so that an effective impedance value for said tuning circuit is negative to oscillate the tuning circuit, the negative impedance controller then varying the negative impedance value so that the effective impedance value becomes positive; and a stop and hold unit comprising a part of said negative impedance controller for stopping the varying of the negative impedance value and maintaining the current negative impedance value when the effective impedance value becomes a positive value such that a predetermined Q value for the tuning circuit is obtained.

6. The tuning circuit according to claim 5, wherein said tuning circuit includes a zero-point detecting circuit for detecting ending of the oscillation of the tuning circuit corresponding to an effective impedance value crossing from a negative impedance value to a positive impedance value.

7. The tuning circuit according to claim 6, wherein said negative impedance controller includes a delay circuit connected to said zero-point detecting circuit, said delay circuit providing an output signal to said stop and hold unit for stopping and maintaining the negative impedance value after the predetermined Q value for the tuning circuit is obtained, the predetermined Q value corresponding to the amount of delay of the output signal from said delay circuit to said stop and hold unit.

8. The tuning circuit according to claim 7, including a control signal generating circuit for controlling a switch circuit on an input side of said tuning circuit and a switch circuit on an output side of said tuning circuit.

9. The tuning circuit according to claim 5, including a control signal generating circuit for controlling a switch circuit on an input side of said tuning circuit and a switch circuit on an output side of said tuning circuit.

10. A tuning circuit comprising:

a resonance circuit including an inductor and a capacitor;

a negative impedance circuit having a negative impedance value connected in series with said resonance circuit;

a digital processing circuit for controlling the negative impedance value of said negative impedance circuit so that an effective impedance value for said tuning circuit is negative to oscillate the tuning circuit, the digital processing circuit then varying the negative impedance value so that the effective impedance value becomes positive; and a zero-point crossing detector for detecting ending of oscillation of the tuning circuit corresponding to an effective impedance value crossing from a negative effective impedance value to a positive effective impedance value to provide a crossing output signal, said digital processing circuit stopping the varying of the negative impedance value of said negative impedance circuit in response to said crossing output signal.

11. The tuning circuit of claim 10, wherein said digital processing circuit comprises an effective resistance setting circuit for storing an effective resistance setting value corresponding to a desired predetermined Q value.

12. The tuning circuit of claim 11, wherein said digital signal processing circuit further comprises:

a clock signal generating circuit;

a digital-analog converter for converting digital count values to analog signal values, the output signals from said digital-analog converter being provided to said negative impedance circuit to control the negative impedance value; and a counter for receiving clock signals from said clock signal generating circuit, the counter outputting count values to said digital-analog converter, said counter being first set so that the count value provided to the digital-analog converter controls the negative impedance value of said negative impedance circuit so that the effective impedance value for said tuning circuit is negative, said clock signal incrementing said counter to increase the effective impedance value of said tuning circuit to a positive value enabling said zero-point crossing detector to detect ending of oscillation of the tuning circuit.

13. The tuning circuit of claim 12, wherein said negative impedance circuit includes a variable resistor controlled by the analog signal values from said digital-analog converter and a negative impedance converter.

14. The tuning circuit according to claim 10, including a control signal generating circuit for controlling a switch circuit on an input side of said tuning circuit and a switch circuit on an output side of said tuning circuit.

* * * * *